(12) United States Patent
Wang et al.

(10) Patent No.: US 8,748,209 B2
(45) Date of Patent: Jun. 10, 2014

(54) SEMICONDUCTOR CHIP PACKAGE STRUCTURE FOR ACHIEVING FLIP-CHIP TYPE ELECTRICAL CONNECTION WITHOUT USING WIRE-BONDING PROCESS AND METHOD FOR MAKING THE SAME

(75) Inventors: Bily Wang, Hsinchu (TW); Hung-Chou Yang, Hsinchu County (TW); Jeng-Ru Chang, Hsinchu County (TW)

(73) Assignee: Harvatek Corporation, Hsinchu (TW)

( * ) Notice: Subject to any disclaimer, the term of this patent is extended or adjusted under 35 U.S.C. 154(b) by 563 days.

(21) Appl. No.: 13/150,299

(22) Filed: Jun. 1, 2011

(65) Prior Publication Data

US 2011/0229991 A1 Sep. 22, 2011

Related U.S. Application Data

(62) Division of application No. 12/648,646, filed on Dec. 29, 2009, now Pat. No. 8,053,904.

(30) Foreign Application Priority Data

Jul. 24, 2009 (TW) .............................. 98125002 A (51) Int. Cl.
*H01L 21/00* (2006.01)
(52) U.S. Cl.
USPC ............... 438/55; 257/E21.499; 257/E21.599

(58) Field of Classification Search
USPC .............. 438/55, 113; 257/E21.499, E21.599
See application file for complete search history.

(56) References Cited

U.S. PATENT DOCUMENTS 6,908,784 B1 * 6/2005 Farnworth et al. ............ 438/106

* cited by examiner

*Primary Examiner* — David Vu
(74) *Attorney, Agent, or Firm* — Rosenberg, Klein & Lee (57) ABSTRACT

A semiconductor chip package structure for achieving flip-chip electrical connection without using a wire-bonding process includes a package unit, a semiconductor chip, a first insulative layer, first conductive layers, a second insulative layer, and second conductive layers. The package unit has a receiving groove. The semiconductor chip is received in the receiving groove and has a plurality of conductive pads disposed on its top surface. The first insulative layer is formed between the conductive pads to insulate the conductive pads. The first conductive layers are formed on the first insulative layer and the package unit, and one side of each first conductive layer is electrically connected to the corresponding conductive pad. The second insulative layer is formed between the first conductive layers in order to insulate the first conductive layers from each other. The second conductive layers are respectively formed on the other opposite sides of the first conductive layers.

11 Claims, 7 Drawing Sheets

SEMICONDUCTOR CHIP PACKAGE STRUCTURE FOR ACHIEVING FLIP-CHIP TYPE ELECTRICAL CONNECTION WITHOUT USING WIRE-BONDING PROCESS AND METHOD FOR MAKING THE SAME

RELATED APPLICATIONS

This application is a Divisional patent application of co-pending application Ser. No. 12/648,646, filed on 29 Dec. 2009, now pending. The entire disclosure of the prior application Ser. No. 12/648,646, from which an oath or declaration is supplied, is considered a part of the disclosure of the accompanying Divisional application and is hereby incorporated by reference.

BACKGROUND OF THE INVENTION

1. Field of the Invention

The present invention relates to a semiconductor chip package structure and a method for making the same, in particular, to a semiconductor chip package structure for achieving flip-chip type electrical connection without using wire-bonding process and a method for making the same.

2. Description of the Related Art

Figure 1:
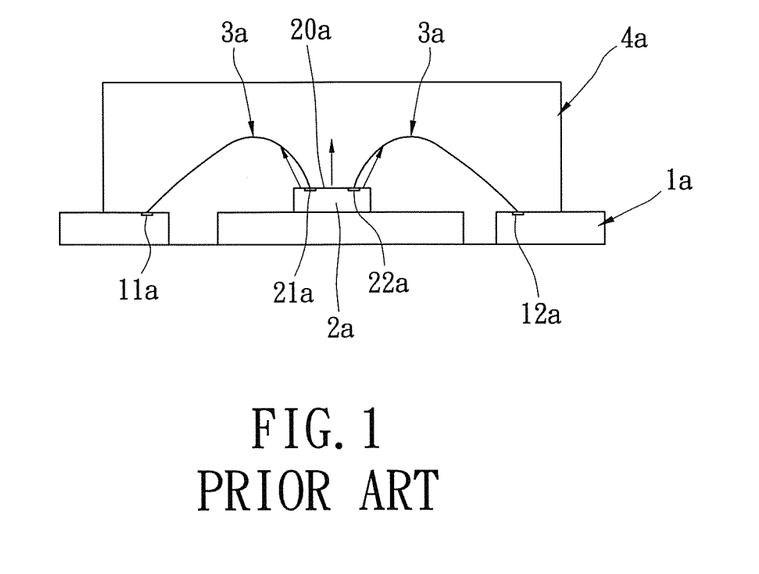
FIG. 1 is a side, schematic view of the LED package structure via a wire-bonding process according to the prior art.

Referring to FIG. 1, a known LED package structure is packaged via a wire-bonding process. The known LED package structure includes a substrate 1a, an LED (light emitting diode) 2a disposed on the substrate, two wires 3a, and a phosphor resin body 4a.

The LED 2a has a light-emitting surface 20a opposite to the substrate 1a. The LED 2a has a positive pole area 21a and a negative pole area 22a electrically connected to two corresponding positive and negative pole areas 11a, 12a of the substrate 1a via the two wires 3a respectively. Moreover, the LED 2a and the two wires 3a are covered with the phosphor resin body 4a for protecting the LED 2a.

However, the method of the prior art not only increases manufacture time and cost, but also leads to uncertainty about the occurrence of bad electrical connections in the LED package structure of the prior art resulting from the wire-bonding process. Moreover, the two sides of the two wires 3a are respectively disposed on the positive and negative pole areas 21a, 22a. Hence, when the light source of the LED 2a is projected outwardly from the light-emitting surface 20a and through the phosphor resin body 4a, the two wires 3a would produce two shadow lines within the light emitted by the LED 2a and thus affect the LED's light-emitting efficiency.

SUMMARY OF THE INVENTION

In view of the aforementioned issues, the present invention provides a semiconductor chip package structure for achieving flip-chip type electrical connection without using wire-bonding process and a method for making the same. Because the semiconductor chip package structure of the present invention can achieve electrical connection without using a wire-bonding process, the present invention can omit the wire-bonding process and avoid bad electrical connection in the semiconductor chip package structure.

To achieve the above-mentioned objectives, the present invention provides a semiconductor chip package structure for achieving flip-chip type electrical connection without using wire-bonding process, including: a package unit, at least one semiconductor chip, a first insulative unit, a first conductive unit, a second insulative unit and a second conductive unit. The package unit has at least one receiving groove. The at least one semiconductor chip is received in the at least one receiving groove and has a plurality of conductive pads disposed on its top surface. The first insulative unit has at least one first insulative layer formed between the conductive pads in order to insulate the conductive pads from each other. The first conductive unit has a plurality of first conductive layers formed on the at least one first insulative layer and the package unit, and one side of each first conductive layer is electrically connected to the corresponding conductive pad. The second insulative unit has at least one second insulative layer formed between the first conductive layers in order to insulate the first conductive layers from each other. The second conductive unit has a plurality of second conductive layers respectively formed on the other opposite sides of the first conductive layers.

To achieve the above-mentioned objectives, the present invention provides a method of making semiconductor chip package structures for achieving flip-chip type electrical connection without using wire-bonding process, including: providing at least two semiconductor chips, wherein each semiconductor chip has a plurality of conductive pads; forming at least one first insulative layer between the conductive pads in order to insulate the conductive pads from each other; arranging the at least two semiconductor chips on an adhesive polymeric substance, wherein the conductive pads face the adhesive polymeric substance; covering the at least two semiconductor chips with a package unit; overturning the package unit and removing the adhesive polymeric substance in order to expose the conductive pads; forming a plurality of first conductive layers on the at least one first insulative layer for respectively and electrically connecting to the conductive pads; forming a plurality of second insulative layers between the first conductive layers in order to insulate the first conductive layers from each other; respectively forming a plurality of second conductive layers on the first conductive layers for electrically connecting to the conductive pads; and forming the semiconductor chip package structures by cutting each second conductive layer, each first conductive layer and the package unit.

Therefore, the semiconductor chip package structure of the present invention can achieve electrical connection without using a wire-bonding process, so that the present invention can omit the wire-bonding process and avoid bad electrical connection in the semiconductor chip package structure.

In order to further understand the techniques, means and effects the present invention takes for achieving the prescribed objectives, the following detailed descriptions and appended drawings are hereby referred, such that, through which, the purposes, features and aspects of the present invention can be thoroughly and concretely appreciated; however, the appended drawings are merely provided for reference and illustration, without any intention to be used for limiting the present invention.

DETAILED DESCRIPTION OF THE PREFERRED EMBODIMENTS

Figure 2:
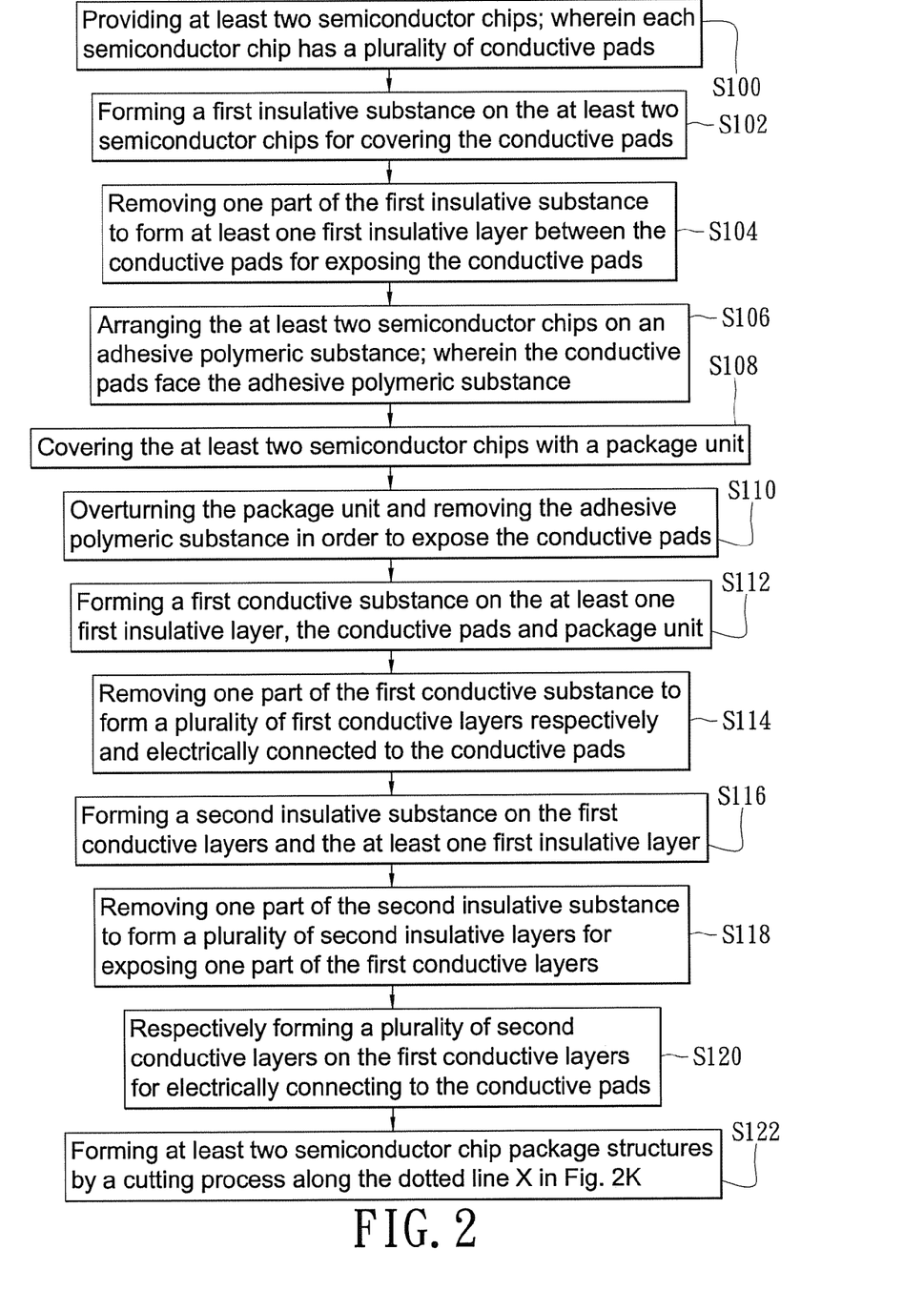
FIG. 2 is a flowchart of the method of making semiconductor chip package structures for achieving flip-chip electrical connection without using a wire-bonding process according to the present invention.
Figure 2A:
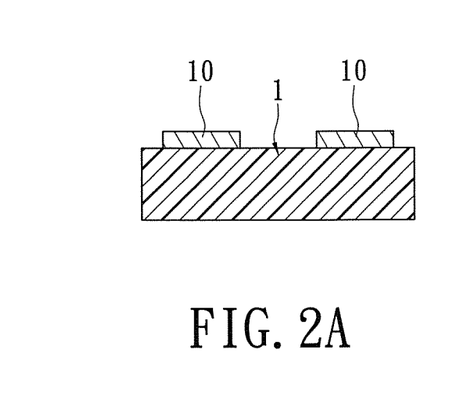
FIGS. 2A to 2L are cross-sectional, schematic views of two semiconductor chip package structures for achieving flip-chip electrical connection without using a wire-bonding process according to the present invention, at different stages of the packaging processes, respectively.

Referring to FIGS. 2 and 2A-2L, the present invention provides a method of making semiconductor chip package structures for achieving flip-chip type electrical connection without using wire-bonding process, including as follows:

Step S100 is: referring to FIGS. 2 and 2A, providing at least two semiconductor chips 1; wherein each semiconductor chip 1 has a plurality of conductive pads 10.

Figure 2B:
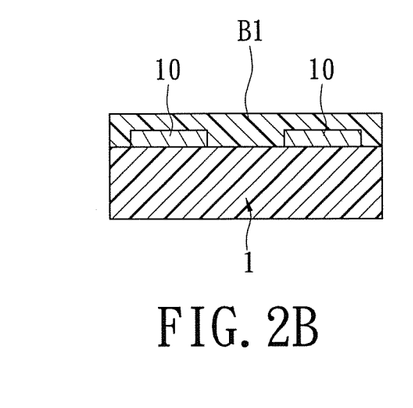

Step S102 is: referring to FIGS. 2 and 2B, forming a first insulative substance B1 on the at least two semiconductor chips 1 for covering the conductive pads 10. In addition, the first insulative substance B1 is formed on the at least two semiconductor chips 1 by printing, coasting or spraying, and the first insulative substance B1 is hardened by pre-curing.

Figure 2C:
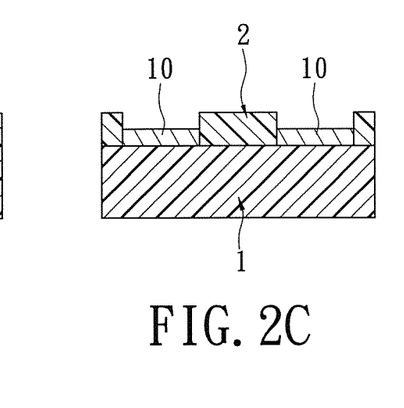

Step S104 is: referring to FIGS. 2 and 2C, removing one part of the first insulative substance B1 to form at least one first insulative layer 2 between the conductive pads 10 for exposing the conductive pads 10. In other words, the one part of the first insulative substance B1 is removed by matching an exposure process, a development process and an etching process to form the at least one first insulative layer 2 between the conductive pads 10 in order to insulate the conductive pads 10 from each other.

Figure 2D:
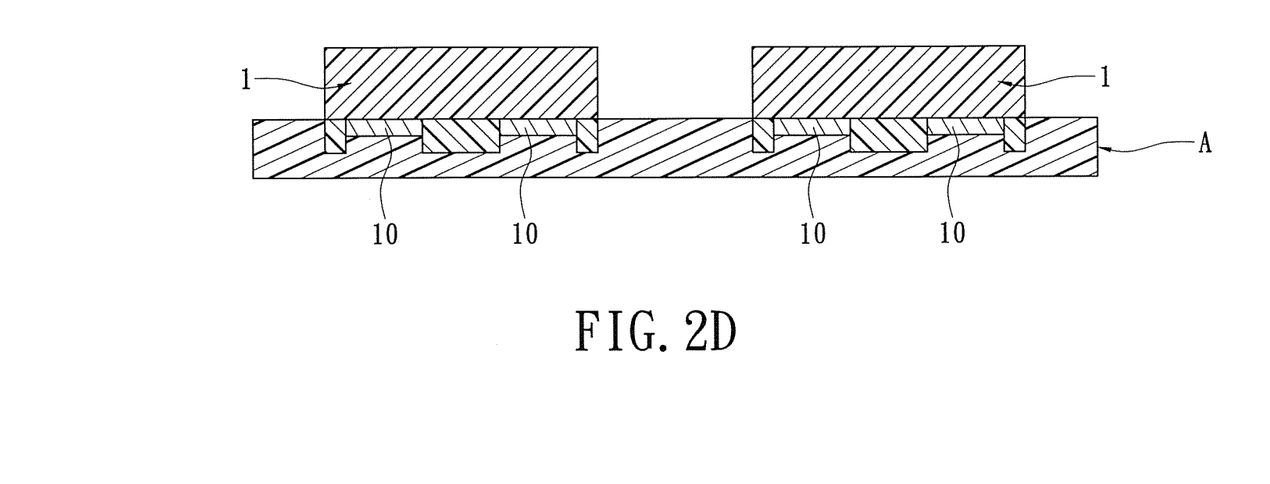

Step S106 is: referring to FIGS. 2 and 2D, arranging the at least two semiconductor chips 1 on an adhesive polymeric substance A; wherein the conductive pads 10 face the adhesive polymeric substance A. In addition, the adhesive polymeric substance A is an adhesive removable substrate that is made of glass, ceramic, crystal substance or plastic, and each semiconductor chip 1 can be an LED (light emitted diode) chip.

Figure 2E:
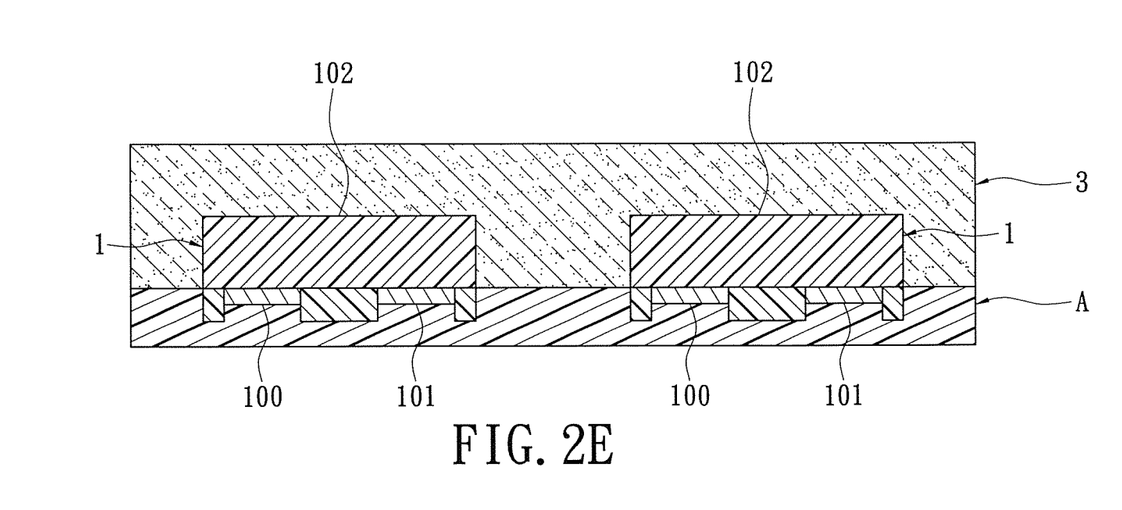

Step S108 is: referring to FIGS. 2 and 2E, covering the at least two semiconductor chips 1 with a package unit 3. In addition, the at least two semiconductor chips 1 are covered with the package unit 3 by coating, spraying, printing or pressure molding. In the present embodiment, the package unit 2 can be a phosphor substance, and the conductive pads 10 of each semiconductor chip 1 are divided into a positive electrode pad 100 and a negative electrode pad 101. In addition, each semiconductor chips 1 has a light-emitting surface 102 on its bottom surface and opposite the conductive pads 10.

Figure 2F:
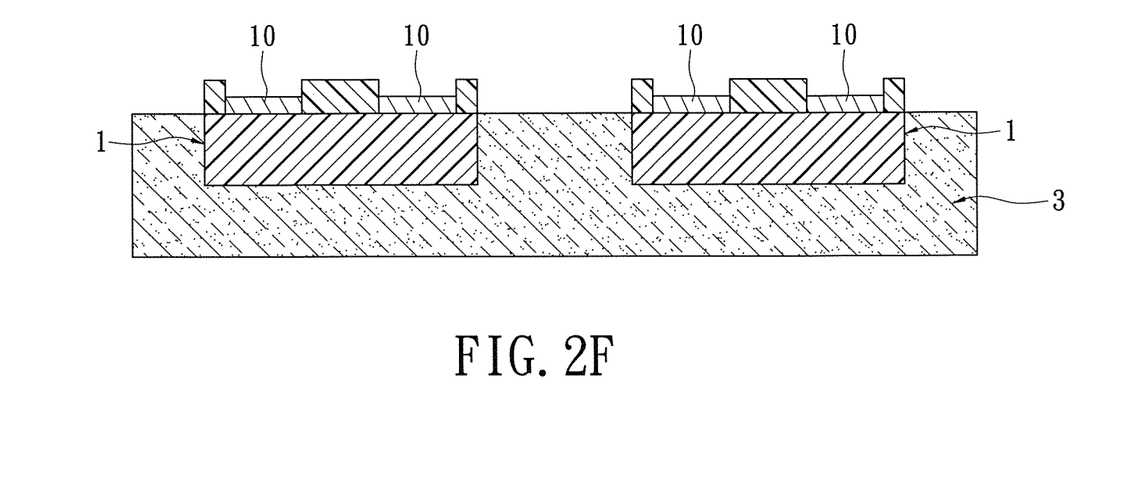

Step S110 is: referring to FIGS. 2 and 2F, overturning the package unit 3 and removing the adhesive polymeric substance A in order to expose the conductive pads 10.

Figure 2G:
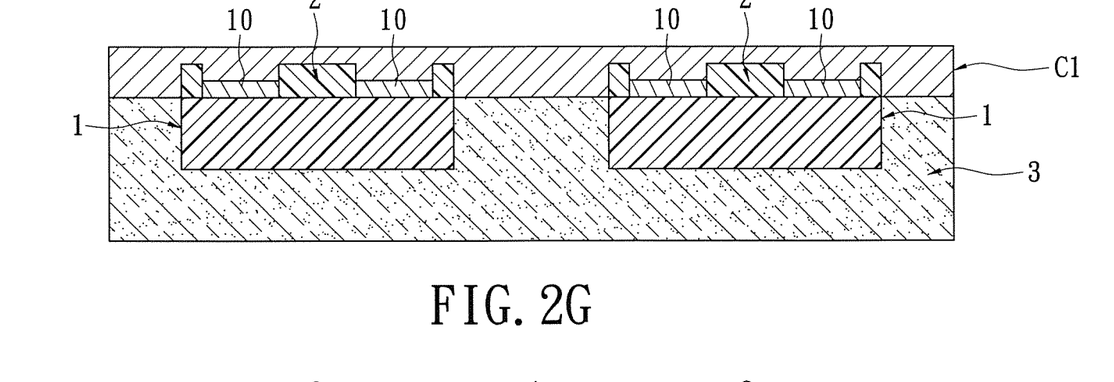

Step S112 is: referring to FIGS. 2 and 2G, forming a first conductive substance C1 on the at least one first insulative layer 2, the conductive pads 10 and package unit 3. In addition, the first conductive substance C1 is formed on the at least one first insulative layer 2, the conductive pads 10 and package unit 3 by evaporating, sputtering, electroplating or electroless plating.

Figure 2H:
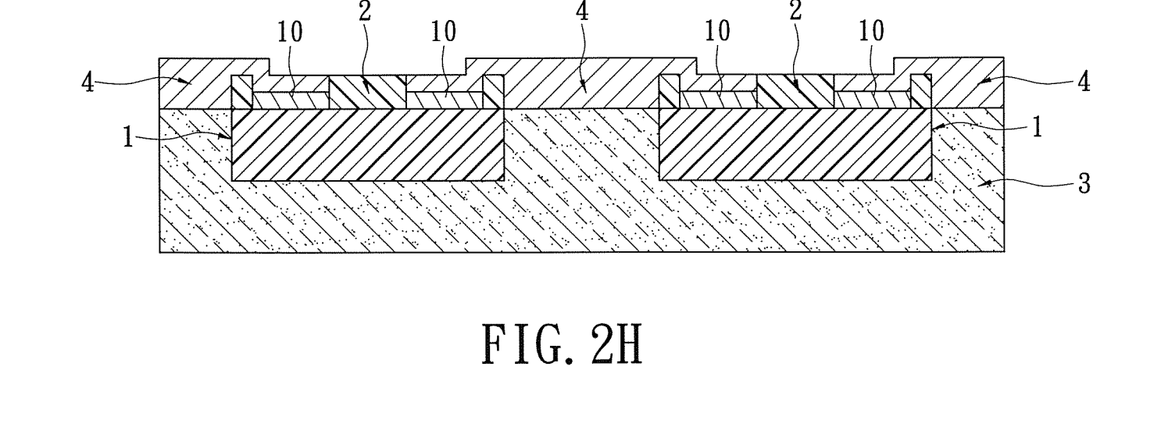

Step S114 is: referring to FIGS. 2 and 2H, removing one part of the first conductive substance C1 to form a plurality of first conductive layers 4 respectively and electrically connected to the conductive pads 10. In other words, the one part of the first conductive substance C1 is removed by matching an exposure process, a development process and an etching process to form the first conductive layers 4 on the at least one first insulative layer 2 and the package unit 3 for respectively and electrically connecting to the conductive pads 10.

Figure 2I:
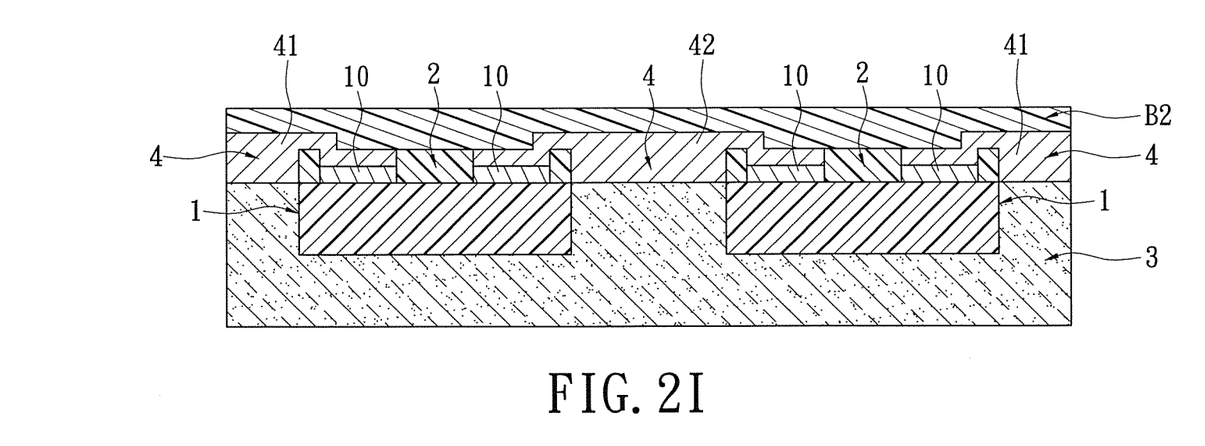

Step S116 is: referring to FIGS. 2 and 2I, forming a second insulative substance B2 on the first conductive layers 4 and the at least one first insulative layer 2. In addition, the second insulative substance B2 is formed on the first conductive layers 4 and the at least one first insulative layer 2 by printing, coasting or spraying, and the second insulative substance B2 is hardened by pre-curing. Furthermore, the first conductive layers 4 are divided into a plurality of first part conductive layers 41 and a plurality of second part conductive layers 42. One side of each first part conductive layer 41 is electrically connected to the corresponding conductive pad 10, and two opposite sides of each second part conducive layer 42 are electrically connected to the two corresponding conductive pads 10.

Figure 2J:
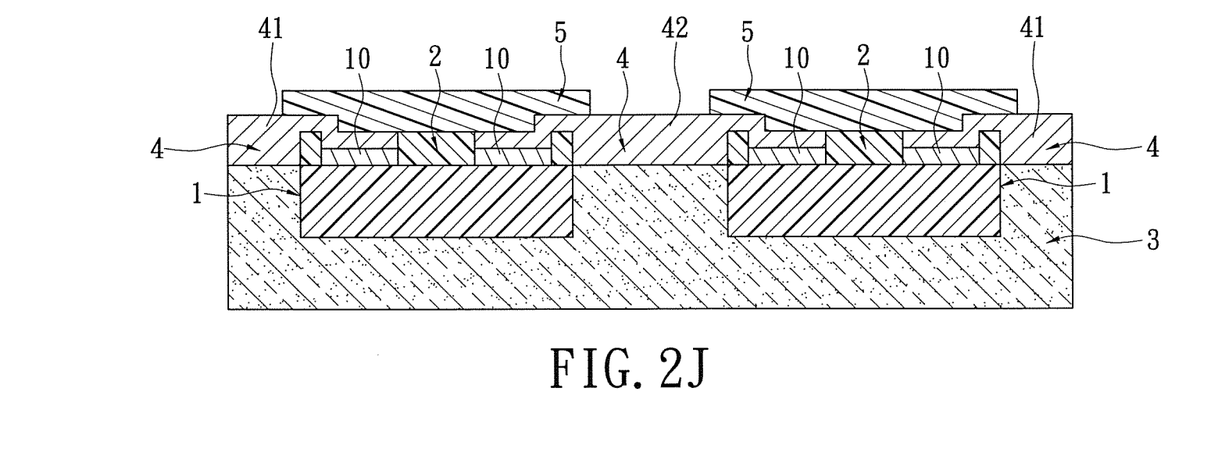

Step S118 is: referring to FIGS. 2 and 2J, removing one part of the second insulative substance B2 to form a plurality of second insulative layers 5 for exposing one part of the first conductive layers 4. In other words, the one part of the second insulative substance B2 is removed by matching an exposure process, a development process and an etching process to form the second insulative layers 5 between the first conductive layers 4 in order to insulate the first conductive layers 4 from each other. Furthermore, each second insulative layer 5 is between each first part conductive layer 41 and each second part conductive layer 42.

Figure 2K:
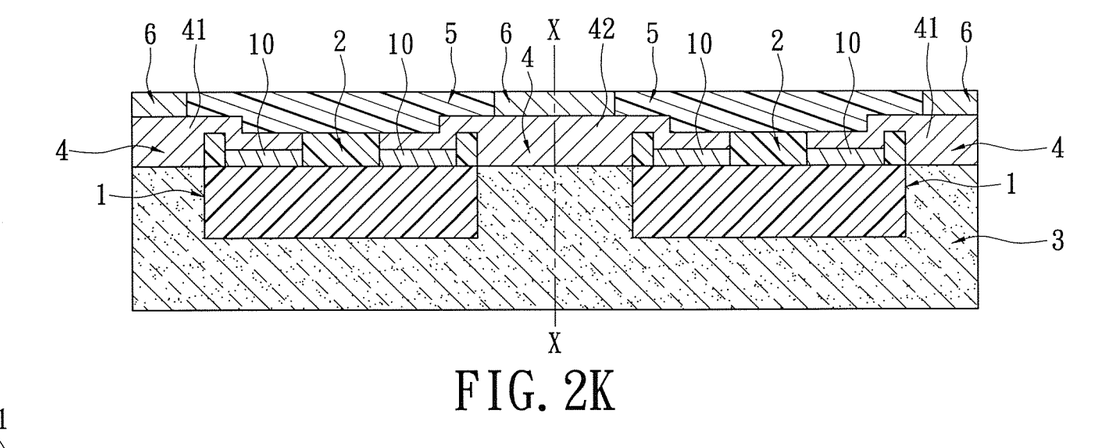

Step S120 is: referring to FIGS. 2 and 2K, respectively forming a plurality of second conductive layers 6 on the first conductive layers 4 for electrically connecting to the conductive pads 10. In addition, the second conductive layers 6 are respectively formed on the first conductive layers 4 by evaporating, sputtering, electroplating or electroless plating. Furthermore, one part of the second conductive layers 6 (the outer second conductive layers 6) is electrically connected to the opposite side of each first part conductive layer 41, and the other part of the second conductive layers 6 (the center second conductive layers 6) is electrically disposed on a center position of each second part conductive layer 42.

Figure 2L:
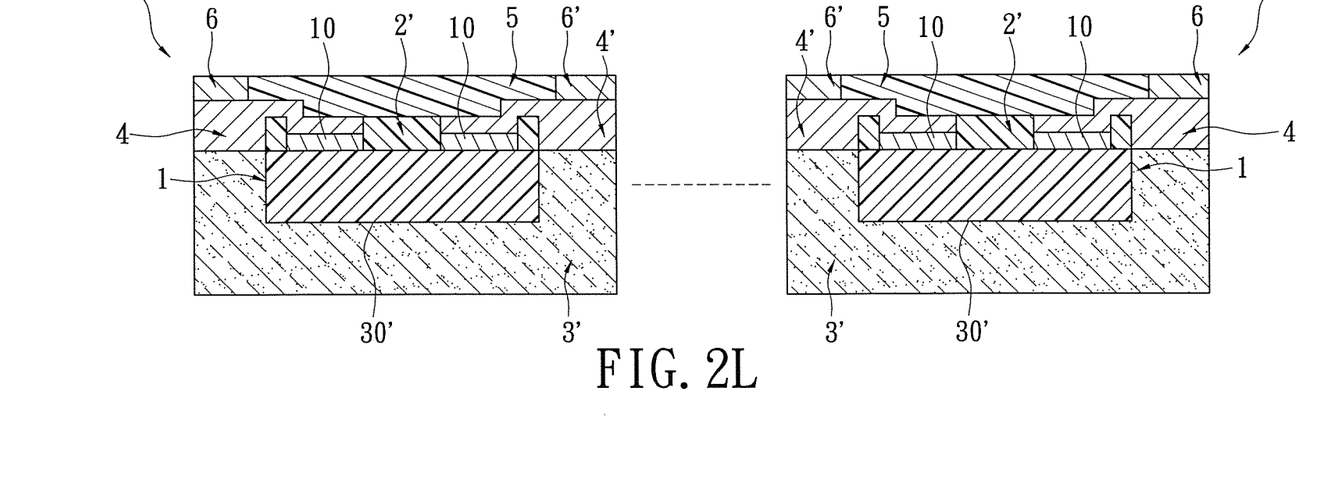

Step S122 is: referring to FIGS. 2 and 2L, forming at least two semiconductor chip package structures (P1, P2) by a cutting process along the dotted line X in FIG. 2K. In other words, the center second conductive layer 6, the second part conductive layer 42 of each first conductive layer 4 and the package unit 3 are cut along the dotted line X in FIG. 2K to form the at least two semiconductor chip package structures (P1, P2).

Therefore, each semiconductor chip package structure (P1, P2) has a semiconductor chip 1, a package unit 3', a first insulative unit, a first conductive unit, a second insulative unit, and a second conductive unit.

The package unit 3' has at least one receiving groove 30'. The semiconductor chip 1 is received in the at least one receiving groove 30' and has a plurality of conductive pads 10 disposed on its top surface. The first insulative unit has at least one first insulative layer 2' formed between the conductive pads 10 in order to insulate the conductive pads 10 from each other.

The first conductive unit has a plurality of first conductive layers (4, 4') formed on the at least one first insulative layer 2' and the package unit 3', and one side of each first conductive layer (4, 4') is electrically connected to the corresponding conductive pad 10. The second insulative unit has at least one second insulative layer 5 formed between the first conductive layers (4, 4') in order to insulate the first conductive layers (4, 4') from each other. The second conductive unit has a plurality of second conductive layers (6, 6') respectively formed on the other opposite sides of the first conductive layers (4, 4').

Furthermore, there are some different choices of the semiconductor chips 1 and the package unit 3 in the present embodiment, as follows:

1. Each semiconductor chip 1 can be an LED (light-emitting diode) chip, and the package unit 3 can be a phosphor substance. The conductive pads 10 of each semiconductor chip 1 are divided into a positive electrode pad 100 and a negative electrode pad 101. For example, the LED chip is a blue LED chip. Therefore, the match of the blue LED chip and the phosphor substance can generate white light.

2. Each semiconductor chip 1 can be an LED (light-emitting diode) chip, and the package unit 3 can be a transparent substance. The conductive pads 10 of each semiconductor chip 1 are divided into a positive electrode pad 100 and a negative electrode pad 101. For example, the LED chip is a white LED chip (composed of red, green and blue LED chips). Therefore, the match of the white LED chip and the transparent substance can generate white light.

3. Each semiconductor chip 1 can be a light-sensing chip, and the package unit 3 can be a transparent substance or a translucent substance. The conductive pads 10 of each semiconductor chip 1 at least are divided into an electrode pad and a signal pad.

4. Each semiconductor chip 1 can be an IC (Integrated Circuit) chip, and the package unit 3 can be an opaque substance. The conductive pads 10 of each semiconductor chip 1 at least are divided into an electrode pad and a signal pad.

The above-mentioned descriptions represent merely the preferred embodiment of the present invention, without any intention to limit the scope of the present invention thereto. Various equivalent changes, alternations or modifications based on the claims of present invention are all consequently viewed as being embraced by the scope of the present invention.

What is claimed is:

1. A method of making semiconductor chip package structures for achieving flip-chip electrical connection without using a wire-bonding process, comprising:
   providing at least two semiconductor chips, wherein each semiconductor chip has a plurality of conductive pads;
   forming at least one first insulative layer between the conductive pads in order to insulate the conductive pads from each other;
   arranging the at least two semiconductor chips on an adhesive polymeric substance, wherein the conductive pads face the adhesive polymeric substance;
   covering the at least two semiconductor chips with a package unit;
   overturning the package unit and removing the adhesive polymeric substance in order to expose the conductive pads;
   forming a plurality of first conductive layers on the at least one first insulative layer for respectively and electrically connecting to the conductive pads;
   forming a plurality of second insulative layers between the first conductive layers in order to insulate the first conductive layers from each other;
   respectively forming a plurality of second conductive layers on the first conductive layers for electrically connecting to the conductive pads; and
   forming the semiconductor chip package structures by cutting each second conductive layer, each first conductive layer and the package unit.

2. The method as claimed in claim 1, wherein the adhesive polymeric substance is an adhesive removable substrate that is made of glass, ceramic, crystal substance or plastic.

3. The method as claimed in claim 1, wherein each semiconductor chip is an LED chip, the package unit is a phosphor substance or a transparent substance, the conductive pads of each semiconductor chip are divided into a positive electrode pad and a negative electrode pad, and the semiconductor chip has a light-emitting surface on its bottom surface and opposite the conductive pads.

4. The method as claimed in claim 1, wherein each semiconductor chip is a light-sensing chip, the package unit is a transparent substance or a translucent substance, and the conductive pads of each semiconductor chip are divided into an electrode pad and a signal pad.

5. The method as claimed in claim 1, wherein each semiconductor chip is an IC (Integrated Circuit) chip, the package unit is an opaque substance, and the conductive pads of each semiconductor chip are divided into an electrode pad and a signal pad.

6. The method as claimed in claim 1, wherein the at least two semiconductor chips are covered with the package unit by coating, spraying, printing or pressure molding.

7. The method as claimed in claim 1, wherein the step of forming at least one first insulative layer further comprises:
   forming a first insulative substance on the at least two semiconductor chips for covering the conductive pads; and
   removing one part of the first insulative substance to form the at least one first insulative layer for exposing the conductive pads;
   wherein the first insulative substance is formed on the at least two semiconductor chips by printing, coasting or spraying, and the first insulative substance is hardened by pre-curing and the one part of the first insulative substance is removed by matching an exposure process, a development process and an etching process.

8. The method as claimed in claim 1, wherein the step of forming the first conductive layers further comprises:
   forming a first conductive substance on the at least one first insulative layer, the conductive pads and the package unit; and
   removing one part of the first conductive substance to form the first conductive layers respectively and electrically connected to the conductive pads;
   wherein the first conductive substance is formed on the at least one first insulative layer, the conductive pads and the package unit by evaporating, sputtering, electroplating or electroless plating, and the one part of the first conductive substance is removed by matching an exposure process, a development process and an etching process.

9. The method as claimed in claim 1, wherein the step of forming the second insulative layers further comprises:
   forming a second insulative substance on the first conductive layers and the at least one first insulative layer; and
   removing one part of the second insulative substance to form the second insulative layers for exposing one part of the first conductive layers;
   wherein the second insulative substance is formed on the first conductive layers and the at least one first insulative layer by printing, coasting or spraying, and the second insulative substance is hardened by pre-curing and the one part of the second insulative substance is removed by matching an exposure process, a development process and an etching process.

10. The method as claimed in claim 1, wherein the second conductive layers are respectively formed on the first conductive layers by evaporating, sputtering, electroplating or electroless plating.

11. The method as claimed in claim 1, wherein the first conductive layers are divided into a plurality of first part conductive layers and a plurality of second part conductive layers, one side of each first part conductive layer is electrically connected to the corresponding conductive pad, two opposite sides of each second part conducive layer are electrically connected to the two corresponding conductive pads, each second insulative layer is formed between each first part conductive layer and each second part conductive layer, one part of the second conductive layers is electrically connected to the opposite side of each first part conductive layer, and the other part of the second conductive layers is electrically disposed on a center position of each second part conductive layer.

\* \* \* \* \*